United States Patent
Lee et al.

(10) Patent No.: US 6,391,793 B2
(45) Date of Patent: *May 21, 2002

(54) COMPOSITIONS FOR ETCHING SILICON WITH HIGH SELECTIVITY TO OXIDES AND METHODS OF USING SAME

(75) Inventors: Whonchee Lee; Pai Pan; Terry Gilton, all of Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/385,197

(22) Filed: Aug. 30, 1999

(51) Int. Cl.⁷ .............................................. H01L 21/302
(52) U.S. Cl. ........................ 438/745; 438/749; 438/750; 438/753; 438/756; 438/757
(58) Field of Search ................................. 438/745, 749, 438/750, 753, 756, 757; 252/75.1

(56) References Cited

U.S. PATENT DOCUMENTS

| | | | |
|---|---|---|---|
| 4,171,242 A | * 10/1979 | Liu | 438/753 |
| 5,454,901 A | * 10/1995 | Tsuji | 438/750 |
| 5,685,951 A | 11/1997 | Torek et al. | 438/396 |
| 5,716,535 A | 2/1998 | Lee et al. | 216/99 |
| 5,734,192 A | 3/1998 | Sengle et al. | 257/506 |
| 5,770,263 A | 6/1998 | Hawthorne et al. | 427/309 |
| 5,868,870 A | * 2/1999 | Fazan et al. | 148/33.3 |
| 5,972,123 A | * 10/1999 | Verhaverbeke | 134/3 |
| 5,981,401 A | * 11/1999 | Torek et al. | 438/745 |
| 6,027,571 A | * 2/2000 | Kikuyama | 134/3 |
| 6,117,350 A | * 9/2000 | Yoon et al. | 216/99 |

* cited by examiner

Primary Examiner—Felisa Hiteshew
Assistant Examiner—Binh X. Tran
(74) Attorney, Agent, or Firm—Mueting, Raasch & Gebhardt, P.A.

(57) ABSTRACT

A silicon etching method includes providing a substrate assembly including an exposed silicon region and an exposed oxide region. An etch composition including an ammonium fluoride component, an inorganic acid component, and an oxidizing agent is also provided. The etch composition has a pH in the range of about 7.0 to about 8.0. The substrate assembly is exposed to the etch composition. Exposing the substrate assembly to the etch composition may result in etching the exposed silicon region at an etching rate that is greater than about 3 times the etching rate of the exposed oxide region and/or etching the silicon region at an etch rate greater than about 9 Å/minute. The etching method may be used in forming isolation structures. Further, etch compositions for performing the desired etch are provided.

31 Claims, 2 Drawing Sheets

COMPOSITIONS FOR ETCHING SILICON WITH HIGH SELECTIVITY TO OXIDES AND METHODS OF USING SAME

FIELD OF THE INVENTION

The present invention relates to methods of semiconductor fabrication. More particularly, the present invention pertains to etching silicon with high selectivity to oxides.

BACKGROUND OF THE INVENTION

There is continued desire for denser integrated circuit devices, e.g., deep submicron technologies. For example, the integration density of memory devices such as dynamic random access memory (DRAM) devices, static random access memory (SRAM) devices, ferroelectric (FE) memory devices, etc., continues to increase. Some processes, such as isolation processes, are continuously changing to allow for further reduction in circuit dimensions. For example, despite the advances made to decrease birds peak and channel encroachment problems when local oxidation of silicon (LOCOS) isolation is used in the fabrication of integrated circuits, such LOCOS techniques may be inadequate for submicron technologies. However, other technologies, such as shallow trench isolation (STI), may fill the need for providing isolation at such submicron dimensions.

For example, generally, in shallow trench isolation, a shallow trench is first etched in the silicon substrate, e.g., at about a 0.3–0.5 micron depth. The shallow trench is then refilled with insulator material, e.g., the trench is filled with silicon dioxide following a short thermal oxidation step used to grow a thin film of thermal oxide on the trench walls to control the silicon/silicon dioxide interface quality. The surface may then be planarized after the trench is refilled to complete the isolation structure.

However, with the use of shallow trench isolation comes a variety of other difficulties, e.g., such as problems associated with the resulting isolation structure or silicon in which it is formed and/or the processes used in forming the trench. For example, in shallow trench isolation (STI) and in the formation of various other integrated circuit structures, it may be desirable to etch silicon at a desirable rate while being highly selective to oxides, e.g., thermal oxide, chemical vapor deposition (CVD) oxide, doped oxides, etc.

Various conventional chemistries have been used to etch silicon. For example, both single crystal and polycrystalline silicon are typically wet etched in mixtures of nitric acid ($HNO_3$) and hydrofluoric acid (HF). With use of such etchants, the etching is generally isotropic. The reaction is initiated by the $HNO_3$, which forms a layer of silicon dioxide on the silicon, and the HF dissolves the silicon oxide away. In some cases, water is used to dilute the etchant, with acetic acid ($CH_3COOH$) being a preferred buffering agent, since it tends to cause less disassociation of $HNO_3$ and thus yields a higher concentration of the disassociated species. The mixture of such compositions can be varied to yield different etch rates. For example, at high HF concentration and low $HNO_3$ concentration, the etch rate is controlled by the $HNO_3$ concentration because in such mixtures there is an excess of HF to dissolve the silicon dioxide created during the reaction of the mixture with the silicon. On the other hand, at a low HF concentration and high $HNO_3$ concentration, the etch rate is limited by the ability of the HF to remove the silicon dioxide as it is created.

In some applications, it is useful to etch silicon more rapidly along some crystal planes relative to others. For example, in the diamond lattice of silicon, generally the (111)-plane is more densely packed than the (100)-plane, and thus the etch rates of (111) orientated surfaces are expected to be lower than those with (100)-orientations. One etchant that exhibits such orientation-dependent etching properties consists of a mixture of KOH and isopropyl alcohol. For example, such a mixture may etch about one hundred (100) times faster along (100)-planes than along (111)-planes.

However, compositions conventionally used for etching silicon are sometimes undesirable. For example, with respect to HF and $HNO_3$, the selectivity to oxides is undesirable, e.g., for some mixtures silicon dioxide actually etches faster than the silicon. Such selectivity characteristics of HF and $HNO_3$ compositions are undesirable, for example, in shallow trench isolation, when it is desirable to etch silicon while leaving oxide material in the trench for isolation. Further, for example, many conventional silicon etchants leave the surface upon which it contacts undesirably rough and may also be undesirably slow at etching the silicon. For example, an SC-1 solution, which is typically a 5:1:1 solution of deionized water, hydrogen peroxide, and ammonium hydroxide, generally etches silicon at a faster rate than silicon dioxide. However, the etch rate for silicon is undesirably slow. As such, to achieve a desired amount of silicon removal requires a higher temperature or lengthy etch process which may result in an undesirably rough silicon surface.

SUMMARY OF THE INVENTION

There is a need for compositions for etching silicon which have a high selectivity to oxides, and also for a method of using such compositions in the fabrication of integrated circuits. For example, such compositions are particularly useful in conjunction with isolation techniques, e.g., shallow trench isolation. According to the present invention, such an etch composition and methods of using such etch compositions are described herein.

A silicon etching method according to the present invention includes providing a substrate assembly including an exposed silicon region and an exposed oxide region. An etch composition including an ammonium fluoride component, an inorganic acid component, and an oxidizing agent is also provided. The etch composition has a pH in the range of about 7.0 to about 8.0; preferably a pH in the range of about 7.5 to about 7.9. The substrate assembly is exposed to the etch composition.

In various embodiments, the ammonium fluoride component may include ammonium fluoride in a range of about 25 percent to about 40 percent by weight of the etch composition, the oxidizing agent may include hydrogen peroxide in a range of about 5 percent to about 15 percent by weight of the etch composition or ozone in a range of about 1 ppm to about 5 ppm of the etch composition; the inorganic acid may be at least one inorganic acid selected from the group of HF, $H_3PO_4$, $H_2SO_4$, HCl, $HNO_3$, and $H_2CO_3$; and the etch composition may have an ionic strength greater than 1, preferably in the range of about 10 to about 100.

Yet in further embodiments, the exposing of the substrate assembly to the etch composition may include etching the exposed silicon region at an etch rate that is greater than about 3 times the etch rate of the exposed oxide region and the etching of the exposed silicon region may be at an etch rate greater than about 9 Å/minute. Preferably, the etched silicon region has a surface roughness in the range of about 1.25 Å RMS to about 1.30 Å RMS.

Another silicon etching method according to the present invention includes providing a substrate assembly including an exposed silicon region and an exposed oxide region and an etch composition comprising ammonium fluoride, an inorganic acid, and an oxidizing agent. The substrate assembly is exposed to the etch composition, wherein exposing the substrate assembly includes etching the exposed silicon region at an etching rate that is greater than about 3 times the etching rate of the exposed oxide region.

In one embodiment of the method, the exposed silicon region may be etched at an etch rate greater than about 9 Å/minute. Further, the etched silicon surface may have a surface roughness in the range of about 1.25 Å RMS to about 1.30 Å RMS.

An etch method for use in forming isolation structures is also described. The method includes providing a silicon substrate and providing an oxide isolation region formed in the silicon substrate. The silicon substrate is etched with an etch composition at an etch rate that is greater than about 3 times an etch rate of the oxide isolation region etched with the etch composition. The etch composition includes ammonium fluoride, an inorganic acid, and an oxidizing agent.

In one embodiment of the method, a silicon region of the silicon substrate adjacent the oxide isolation region is of a different thickness than a nonadjacent silicon region. The difference in thickness is in a range of about 100 Å to about 200 Å. Further, the etching of the silicon substrate with the etch composition reduces the thickness difference to less than about 30 Å.

In another embodiment of this method, the provision of the silicon substrate and the oxide isolation region formed therein includes etching a trench in the silicon substrate after patterning a stack of at least a thermal oxide layer and a silicon nitride layer, filling the trench with at least one oxide material, and removing the patterned stack. The removal of the patterned stack includes an overetch to entirely remove the thermal oxide layer resulting in the silicon region adjacent the oxide isolation region that is of a different thickness than the nonadjacent silicon region.

A silicon etch composition according to the present invention includes an ammonium fluoride component, an inorganic acid component, and an oxidizing agent. The etch composition has a pH in the range of about 7.0 to about 8.0. More preferably, the etch composition has a pH in the range of about 7.5 to about 7.9.

Another etch composition according to the present invention includes ammonium fluoride, an inorganic acid, and an oxidizing agent. The etch composition is capable of etching silicon at an etch rate that is greater than about 3 times the etch rate of oxide.

DETAILED DESCRIPTION OF THE EMBODIMENTS

Figure 1:
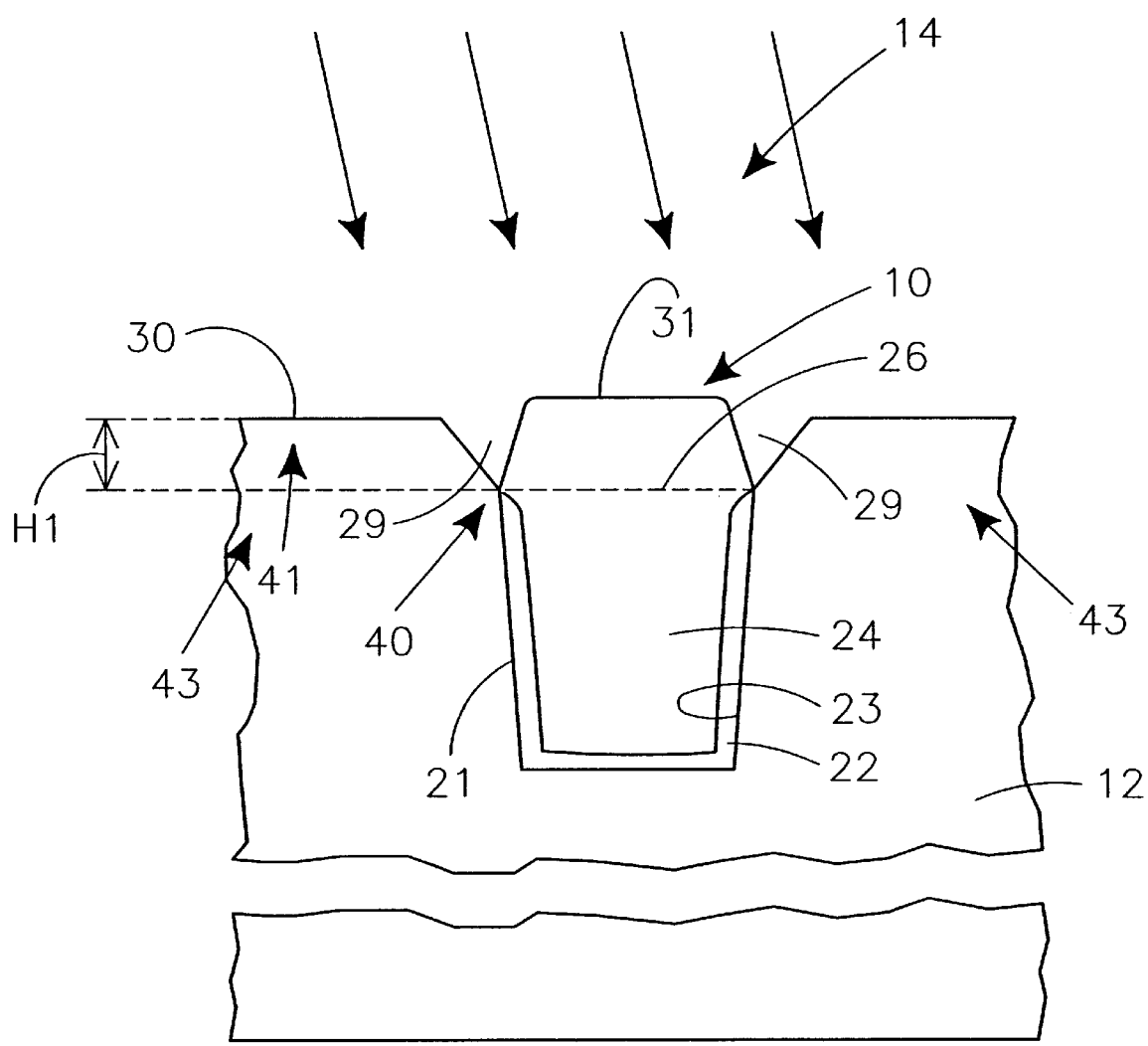
FIG. 1 is illustrative of an isolation structure wherein the silicon substrate is being etched by a composition according to the present invention with high selectivity to the oxide filling the trench of the isolation structure.

Etch compositions for etching silicon with high selectivity to oxides according to the present invention shall be generally described below. Thereafter, the present invention shall be generally described with reference to FIGS. 1 and 2, wherein an isolation structure is formed, for example, such as by shallow trench isolation techniques, including use of an etch composition according to the present invention. With the description as provided below, it will be readily apparent to one skilled in the art that the etch compositions described herein may be used in various applications. In other words, the etch compositions may be used whenever a silicon etch is being performed and wherein high selectivity to oxide material is desired. For example, the present invention may be used in the formation of isolation structures for use in the fabrication of integrated circuits. Further, for example, the present invention may be beneficial in the fabrication of memory devices, such as DRAMs and SRAMs.

In this application, a semiconductor substrate refers to a base semiconductor layer, e.g., the lowest layer of silicon material of the wafer, or silicon deposited on another material, such as silicon on sapphire, silicon on insulator, etc. Further, as used herein, substrate assembly refers to a semiconductor substrate having one or more layers or structures formed thereon or regions formed therein. When reference is made to a substrate assembly in the following description, various process steps may have been previously used to form or define regions, junctions, various structures or features, and openings. For example, a substrate assembly as used herein may include a semiconductor substrate having an isolation structure, e.g., shallow trench isolation structure, formed relative to the semiconductor substrate.

According to the present invention, an etch composition for use in etching silicon with a high selectivity to oxides generally is an HF-containing solution. The HF-containing solution is such that when the reaction of the etch composition with silicon forms silicon dioxide, the HF-containing solution dissolves the silicon dioxide formed thereby away. However, not all HF-containing compositions will etch silicon with desirable high selectivity to oxide as previously described in the Background of the Invention section herein, e.g., HF and $HNO_3$ mixture.

Generally, a suitable etch composition according to the present invention for etching silicon at a desirable rate with a desired selectivity to oxide is an $HF_2^-$ containing solution preferably having a pH in the range of about 7.0 to about 8.0. More preferably, the etch composition has a pH of about 7.5 to about 7.9. Further, preferably, the ionic strength of the etch composition is greater than one; more preferably, the ionic strength is in the range of about 10 to about 100. As used herein, ionic strength refers to a measure of the average electrostatic interaction among ions in the composition which is equal to one-half the sum of the terms obtained by multiplying the molality of each ion by its valence squared. Yet further, preferably, the redox potential of the etch composition is in the range of about −0.5 to about +0.5 (vs. Standard Hydrogen Electrode (SHE)). As used herein, the redox potential is a measure of the effectiveness of the etch composition as an oxidizing agent, i.e., the ability of the etch composition to oxidize silicon for removal by the HF component of the etch composition.

Preferably, the etch composition includes an ammonium fluoride component, an inorganic acid component, and an oxidizing agent. Preferably, the ammonium fluoride component is provided by a desired concentration of $NH_4F$. The ammonium fluoride component may be formed with a mixture of ammonium hydroxide and HF.

The oxidizing agent of the etch composition may be any oxidizing agent such as hydrogen peroxide or ozone. Preferably, the oxidizing agent is hydrogen peroxide.

Preferably, the inorganic acid component includes at least one acid selected from hydrofluoric acid (HF), phosphoric acid ($H_3PO_4$), sulfuric acid ($H_2SO_4$), nitric acid ($HNO_3$), hydrochloric acid (HCl), carbonic acid ($H_2CO_3$), or any other suitable inorganic acid. Preferably, the inorganic acid is $H_3PO_4$ or $H_2CO_3$. Inorganic acids are commercially available as concentrated solutions (X) which then typically are diluted to a desired concentration ($H_2O:X$). For example, commercially available concentrated acids are available as follows: HCl is 37% by weight in deionized water; $HNO_3$ is 70% by weight in deionized water; $H_2SO_4$ is 96% by weight in deionized water, and $H_3PO_4$ is 85% by weight in deionized water. Concentrations of etch compositions described herein are given based on commercially available solutions. For example, if the etch composition has a concentration of 30% HCl, then the solution includes 30% by weight of the commercially available HCl solution. Hydrogen peroxide ($H_2O_2$) is also commercially available as a concentrated solution of approximately 29% by weight in deionized water. Further, ammonium fluoride is also commercially available as a concentrated solution, approximately 40% by weight in deionized water. Further, one will recognize that multiple components of the solution may be provided from commercially available solutions. For example, QEII available from Olin Microelectronics Materials (Newalk, Conn.) provides both $NH_4F$ and an inorganic acid that is used to adjust the pH of the solution.

Preferably, the etch composition includes $NH_4F$ in a range of about 25 percent to about 40 percent by weight of the etch composition and includes $H_2O_2$ in the range of about 5 percent to about 15 percent by weight of the etch composition; the remainder of etch composition being preferably inorganic acid. For example, the etch composition may preferably include a volumetric ratio of $NH_4F:QEII:H_2O_2$ of about 4:2:3. Further, for example, the etch composition may preferably include a $NH_4F$:inorganic acid:$H_2O_2$ ratio of about 120:1:44.

The above ranges for the etch composition are particularly applicable to the use of ammonium fluoride and hydrogen peroxide but appear to be equally applicable to etch compositions having other combinations of components as described above, such as when ammonium fluoride is provided by ammonium hydroxide and hydrofluoric acid. In other words, suitable amounts of ammonium hydroxide and hydrofluoric acid may be mixed to provide an adequate amount of ammonium fluoride. When ozone is used as the oxidizing agent, ozone is preferably present in a range of about 1 parts per million (ppm) to about 5 ppm.

Generally, to etch silicon according to the present invention with the etch composition, the etch includes immersing the silicon to be etched into a tank of the etch composition. Although immersion in the etch composition is preferred, the etch composition may also be sprayed onto the wafers being etched or may be introduced for contact with the wafer in any other manner, e.g., drip, vapor, etc.

Generally, the cleaning process is performed at a temperature in the range of about 20° C. to about 30° C. Higher temperatures may be used; however, such higher temperatures lead to increased roughness of the silicon surface remaining after the completion of the etch using the etch composition.

Preferably, according to the present invention, the etch composition is such that the etch rate of silicon using the etch composition is greater than 3 times the etch rate of an oxide being exposed to the same etch composition, i.e., the selectivity between silicon and oxide is greater than 3. More preferably, the selectivity between silicon and oxide using the etch composition is greater than 6.

Further, to achieve desired throughput of wafers, the etch rate for silicon using the etch composition is preferably greater than about 9 Å/min. More preferably, the etch rate for silicon is greater than 18 Å/min.

Preferably, the etch composition is such that after removal of silicon using the etch composition the silicon surface has a desired surface roughness adequate for later processing. Preferably, the roughness of the silicon surface following the etch is within the range of about 1.25 Å RMS to about 1.30 Å RMS. More preferably, the silicon surface falls within such ranges for roughness after more than 180 Å of silicon is removed. Generally, for example, roughness may be determined by Atomic Force Microscopy (AFM) which scans a surface area of about 1 $\mu m^2$ and gives an average peak-to-valley measurement across this 1 $\mu m^2$ surface area, rms.

Preferably, the high selectivity to oxide as described above is a high selectivity to thermal oxide. For example, such thermal oxide may be formed by thermal oxidation such as with use of a wet or dry furnace oxidation. However, such selectivity is also applicable to oxides formed by chemical vapor deposition (CVD), such as high density plasma oxide typically used in isolation processes, such as shallow trench isolation.

Although the present invention may be used in any application where there is a need for a silicon etch with high selectivity to oxide, the present invention shall be described further below with reference to FIGS. 1 and 2 wherein the silicon etch follows process steps used to form a shallow trench isolation structure in the fabrication of integrated circuits. This particular embodiment is given for illustrative purposes and is not to be taken as unduly limiting to the present invention. The etch composition of the present invention as described in the accompanying claims may be used in various other applications, such as silicon corner rounding, or any other process including a silicon etch step wherein selectivity to oxide is required.

FIG. 1 shows a shallow trench isolation structure 10 being formed relative to silicon substrate 12. As shown in FIG. 1, a trench 21 is defined in the silicon substrate 12. The trench 21 is filled with an oxide material 24. For example, the trench may be filled with CVD deposited high density plasma silicon dioxide 24 after a short thermal oxidation growth process is used to form thermal oxide film 22 on walls 23, e.g., sidewalls and bottom surface, of the trench 21.

Generally, following at least one step in the process of shallow trench isolation, a generally non-uniform silicon substrate is present. For example, such a non-uniform silicon substrate is shown in FIG. 1 by the difference in thickness at region 41 of the silicon substrate 12 as opposed to the thickness of the silicon substrate 12 at region 40 adjacent the silicon trench isolation structure 10. As figuratively shown in FIG. 1, H1 represents the variation in thickness of the silicon substrate.

Further, generally, the variation in silicon thickness, such as the variation between region 40 adjacent the isolation structure 10 versus a region 41 nonadjacent to the isolation structure, is a result of one or more steps in the shallow trench isolation process. For example, region 29 adjacent the oxide material 24 of the isolation structure 10 may be created during the shallow trench isolation process when an overetch is performed to remove a pad oxide layer which was formed over the silicon surface 30 in the process of defining and/or refilling trench 21. Further, for example, such an overetch may have been used to remove a sacrificial oxide layer which was formed over the surface 30 in the process of defining and/or refilling trench 21. For example, an overetch step may remove an additional 30 Å or more of oxide material from the exposed surface 31 of the oxide material 24 to make sure that all the pad oxide or sacrificial oxide on silicon surface 30 is removed.

Generally, a variation in a silicon thickness, as generally represented by reference line 26 and silicon surface 30, is in the range of about 100 Å to about 200 Å. Preferably, an etch according to the present invention using the etch composition 14 described previously herein is used to remove silicon from the exposed silicon surface 30, to decrease the silicon thickness variation to less than about 30 Å. In other words, as shown in FIGS. 1 and 2, H1 which may be in the range of about 100 Å to about 200 Å is reduced to the thickness variation of less than about 30 Å as represented by H2 in FIG. 2. An etch composition according to the present invention is used to etch the silicon 12 at the surface 30 while being highly selective to the oxide material 24 such that the isolation provided by the isolation structure 10 is not undesirably affected.

The structure shown in FIG. 1 may be the result of any trench isolation process wherein any number of process steps may be used to form oxide material 24 in the defined trench 21 for the purposes of isolation in an integrated circuit. Generally, conventional techniques result in some silicon substrate thickness variation as represented generally by H1 and the region 29 adjacent oxide material 24. For example, one illustrative shallow trench isolation method may include the deposition of a pad oxide layer (not shown) on the silicon substrate 12 and thereover the formation of a silicon nitride layer (not shown) on the pad oxide layer (not shown). A layer of photoresist (not shown) is patterned on the silicon nitride layer (not shown) defining trench 21. Thereafter exposed regions of silicon nitride (not shown), pad oxide (not shown), and the silicon substrate 12 are removed to form trench 21. Various impurity diffusion processes may be performed to form doped wells in the silicon substrate 12 using one or more different techniques.

After definition of the trench 21, a thermal oxide layer 22 may be formed on the walls of the trench, e.g., sidewalls and bottom surface. An oxide is then formed to fill the trench 21 to a height at least as great as the silicon nitride/pad oxide stack used for defining the trench 21. Generally, the oxide material 24 is a high density plasma (HDP) oxide material.

The formed oxide material may then be planarized using the silicon nitride as a stop layer. Thereafter, the silicon nitride and pad oxide layer are removed using known methods, such as phosphoric acid etching for the silicon nitride removal and an HF or an RCA clean to remove the pad oxide. As indicated previously, to make sure that the entire pad oxide on the silicon surface 30 is removed, an overetch is performed which may result in the regions 29 and the non-uniform thickness of silicon substrate 12. For example, the pad oxide may be a 100 to 200 Å layer of thermal oxide which is removed with an HF etch. To make sure that the entire pad oxide is removed, a 30 Å overetch removing 30 Å of exposed oxide material 24 from surface 31 may be performed.

Further, a sacrificial pad oxide and removal process may be used to eliminate any undesirable silicon nitride formation under the pad oxide layer. For example, as conventionally known, a sacrificial oxide layer may be formed after removal of the silicon nitride/pad oxide stack. The sacrificial oxide layer may then be removed by wet etching before growing a final gate oxide on the silicon substrate 12. The wet etch of the sacrificial oxide may once again consume part of the oxide material 24 and result in variation in the thickness of the silicon substrate 12 as represented by the height difference H1 between regions 40 and 41 in FIG. 1.

It will be recognized by one skilled in the art that with non-uniform thickness of the silicon substrate 12, particularly in regions 29 adjacent oxide material 24, leakage across junctions of devices created in active areas (those areas represented generally by arrow and numeral 43) may occur. Such leakage across the junctions would be particularly apparent in submicron technologies, and more particularly problematic in 0.15 micron technologies or less.

With a structure as shown in FIG. 1, the etch composition 14 according to the present invention may be used to remove silicon material to smooth and make more uniform the thickness of the silicon substrate 12 while having a high selectivity to oxide material 24. Preferably, it is desirable to remove silicon material along the (100)-plane (i.e., the plane coinciding with the horizontal reference line 26) as opposed to the silicon surface defining the regions 29.

Further, preferably, it may be desirable to remove greater than 50 Å of silicon while removing very little oxide material 24. Preferably, the difference in thickness or the nonuniformity of the silicon substrate 12 is represented generally by H1 which may be approximately 100 Å to 200 Å. It is preferred that this nonuniformity be reduced to less than about 30 Å according to the present invention.

Preferably, an etch composition according to the previous description herein is used which has a selectivity between silicon and an oxide material which is greater than about 3. In other words, it is preferred that silicon is etched 3 times as fast as the oxide material 24. Further, preferably, the rate of etching the silicon 12 with the etch composition 14 is greater than about 9 Å/min.

Figure 2:
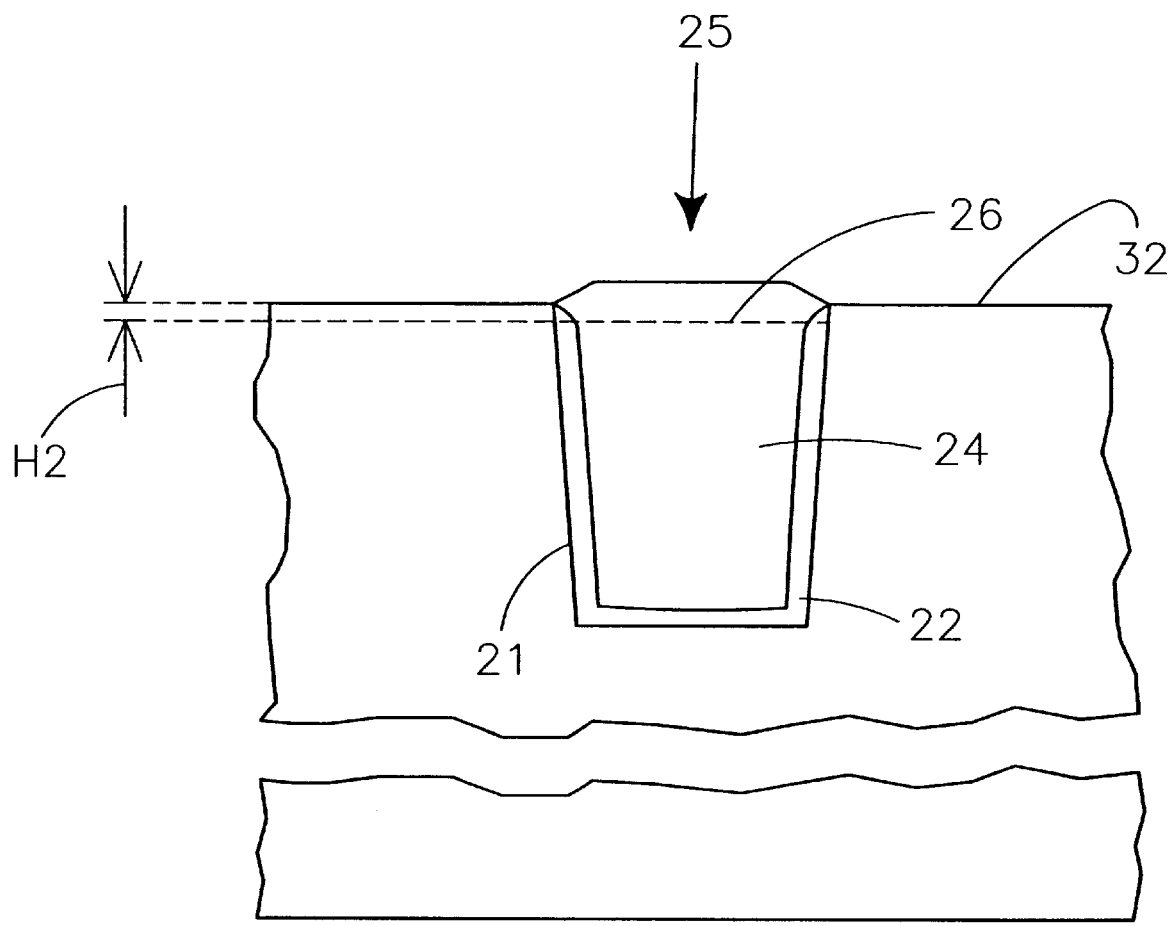
FIG. 2 is an illustrative diagram showing the isolation structure after the silicon etch illustrated in FIG. 1.

FIG. 2 represents the resulting isolation structure 25 including oxide material 24 and thermal oxide layer 22 lining trench 21 after the silicon etch is performed with the etch composition 14. The silicon surface 30 as shown in FIG. 1 is smoothed such that the thickness differential H1 is reduced to a thickness differential of H2. Preferably, the thickness differential or non-uniformity of thickness is less than about 30 Å. Further, in accordance with the present invention, the resulting silicon surface 32 is preferably of a roughness in the range of about 1.25 to about 1.30 Å RMS.

After performing the silicon etch according to the present invention to selectively remove silicon relative to the silicon dioxide 24 filling trench 21, a gate oxide may then be formed on surface 32 followed by any number of fabrication steps for forming an integrated circuit as desired. For example, transistors, capacitors etc. may be formed in the fabrication of memory devices.

The following examples illustrate the advantages of an etch composition according to the present invention relative to conventional silicon etch compositions. Each of the Examples were conducted at least twice to obtain measurements and parameters that could be averaged. In each of the Examples, the etch rate of silicon was obtained by providing a silicon wafer having an oxide mask thereon for use in forming trenches in the silicon. The oxide mask had a thickness of about 200 Å. Prior to subjecting the silicon wafer to the etch composition given in the particular Example, AFM was used to measure the depth of the trench defined by the oxide mask. Following the exposure of the silicon wafer to the etch composition of the particular Example, AFM was used to make a post etch depth measurement for the trench etched in the silicon wafer. Determination of the silicon etch rate was then determined based on the time of exposure to the etch composition.

In each of the Examples, the etch rate of thermal oxide was obtained by providing a silicon wafer having a layer of thermal oxide formed thereon to a particular thickness. Prior to subjecting the thermal oxide to the etch composition given in the particular Example, AFM was used to measure the thickness of the thermal oxide. Following the exposure of the thermal oxide to the etch composition of the particular Example, AFM was used to measure the thickness of the thermal oxide. Determination of the thermal oxide rate was then determined based on the time of exposure to the etch composition.

EXAMPLE 1

Wafers were etched in a hydrofluoric acid/hydrogen peroxide composition including about 0.1% by volume of hydrofluoric acid and about 99.9% by volume of hydrogen peroxide. The selectivity between silicon and thermal oxide (i.e., the ratio of etch rate of silicon:etch rate of thermal oxide) was less than 1.

EXAMPLE 2

Wafers were etched in a hydrofluoric acid and nitric acid composition including about 1% by volume of hydrofluoric acid and about 99% by volume of nitric acid. The selectivity between silicon and thermal oxide was less than 1.

EXAMPLE 3

Wafers were etched in a polysilicon etch composition including 2% hydrofluoric acid, 40% nitric acid, and 58% acetic acid. The selectivity between silicon and thermal oxide was less than 1.

EXAMPLE 4

Wafers were etched in a composition of hydrofluoric acid and ozone. Ozone was present in an amount of about 10 ppm. The selectivity between silicon and thermal oxide was less than 1.

EXAMPLE 5

Wafers were etched in an APM etch composition. The selectivity between silicon and thermal oxide was in the range of about 2 to about 3. The chemical composition of APM etchant used had a ratio of $NH_4OH:H_2O_2:H_2O$ in the range of about 1:2:40 at 50° C. to 1:1:5 at 65° C. Further, the APM etch composition in the above ranges roughened the silicon surface of the wafer depending on the amounts of silicon removed. For example, a 5 minute APM clean using $NH_4OH:H_2O_2:H_2O$ at a ratio of 1:4:20 at 55° C. for 5 minutes removed 20 Å of silicon and yielded a silicon surface having a roughness of about 1.25 Å RMS. Further, when such wafers exposure to the solution was continued for 60 minutes, about 100 Å of silicon was removed but with a resulting silicon surface having a roughness of about 1.45 Å RMS.

EXAMPLE 6

Wafers were etched in an etch chemistry of $NH_4F:QEII:H_2O_2$ at a ratio of 1:1:7; at a pH of about 6.7 (where QEII has a chemistry of 39 weight % $NH_4F$; 1 weight % $H_3PO_4$; and the balance water); at 21.5° C.; and for 10 minutes. An etch rate of silicon of about 8.5 Å/min resulted.

EXAMPLE 7

Wafers were etched in an etch composition of $NH_4F:QEII:H_2O_2$ at a ratio of 1.5:0.5:8; at a pH of 6.5; at 21.5° C.; and for 10 minutes. A roughness of about 1.6 Å RMS resulted.

EXAMPLE 8

Wafers were etched in an etch composition having the chemistry $NH_4F:QEII:H_2O_2$ at a ratio of 4:2:3; a pH of 7.6; at the temperature of 27.3° C.; for 10 minutes. A silicon etch rate of about 18 Å/minute and a thermal oxide etch rate of about 3 Å/minute resulted. The resultant roughness of the silicon surface after removal of 180 Å of silicon after 10 minutes of soaking time was about 1.25 to 1.3 Å RMS.

All patents and references cited herein are incorporated in their entirety as if each were incorporated separately. This invention has been described with reference to illustrative embodiments and is not meant to be construed in a limiting sense. As described previously, one skilled in the art will recognize that various other illustrative applications may utilize the etch compositions described herein. Various modifications of the illustrative embodiments, as well as additional embodiments of the invention, will be apparent to persons skilled in the art upon reference to this description.

What is claimed is:

1. A silicon etching method comprising:
   providing a substrate assembly comprising at least a silicon containing surface;
   providing an oxide material in a region defined in at least a portion of the silicon containing surface resulting in an exposed silicon surface region and an exposed oxide region defined therein;
   providing an etch composition comprising an ammonium fluoride component, an inorganic acid component, and an oxidizing agent, wherein the etch composition has a pH in the range of about 7.0 to about 8.0; and
   exposing the exposed silicon surface region and the exposed oxide region defined therein to the etch composition.

2. The method of claim 1, wherein the ammonium fluoride component of the etch composition is provided by providing ammonium and hydrofluoric acid.

3. The method of claim 1, wherein exposing the substrate includes exposing the substrate to the etch composition at a temperature in the range of about 20° C. to about 30° C.

4. The method of claim 1, wherein the etch composition has a pH in the range of about 7.5 to about 7.9.

5. The method of claim 1, wherein exposing the substrate assembly to the etch composition includes etching the exposed silicon region at an etch rate that is greater than about 3 times the etch rate of the exposed oxide region.

6. The method of claim 5, wherein etching the exposed silicon region results in a silicon surface having a surface roughness in the range of about 1.25 Å RMS to about 1.30 Å RMS.

7. The method of claim 1, wherein the etch composition has an ionic strength greater than 1.

8. The method of claim 7, wherein the etch composition has an ionic strength in the range of about 10 to about 100.

9. The method of claim 8, wherein etching the exposed silicon region includes etching the exposed silicon region at an etch rate greater than about 9 Å/minute.

10. The method of claim 1, wherein the ammonium fluoride component includes ammonium fluoride in a range of about 25 percent to about 40 percent by weight of the etch composition.

11. The method of claim 10, wherein the oxidizing agent is ozone in a range of about 1 ppm to about 5 ppm of the etch composition.

12. The method of claim 10, wherein the oxidizing agent is hydrogen peroxide in a range of about 5 percent to about 15 percent by weight of the etch composition.

13. The method of claim 12, wherein the inorganic acid is at least one inorganic acid selected from the group consisting of HF, $H_3PO_4$, $H_2SO_4$, HCl, $HNO_3$, and $H_2CO_3$.

14. A silicon etching method comprising:
providing a substrate assembly comprising at least an exposed silicon surface region and an exposed oxide region formed therein;
providing an etch composition comprising ammonium fluoride, an inorganic acid, and an oxidizing agent; and
exposing at least the exposed silicon surface region and the exposed oxide region formed therein to the etch composition, wherein exposing at least the exposed silicon surface region and the exposed oxide region formed therein comprises etching the exposed silicon surface region at an etching rate that is greater than about 3 times the etching rate of the exposed oxide region formed therein.

15. The method of claim 14, wherein exposing the substrate includes exposing the substrate to the etch composition at a temperature in the range of about 20° C. to about 30° C.

16. The method of claim 14, wherein the etch composition has an ionic strength greater than 1.

17. The method of claim 16, wherein the etch composition has an ionic strength of about 10 to about 100.

18. The method of claim 14, wherein etching the exposed silicon region includes etching the exposed silicon region at an etch rate greater than about 9 Å/minute.

19. The method of claim 18, wherein etching the exposed silicon region results in a silicon surface having a surface roughness in the range of about 1.25 Å RMS to about 1.30 Å RMS.

20. The method of claim 14, wherein the etch composition has a pH in the range of about 7.0 to about 8.0.

21. The method of claim 20, wherein the etch composition comprises ammonium fluoride in a range of about 25 percent to about 40 percent by weight of the etch composition and hydrogen peroxide in a range of about 5 percent to about 15 percent by weight of the etch composition.

22. The method of claim 21, wherein the inorganic acid is at least one inorganic acid selected from the group consisting of HF, $H_3PO_4$, $H_2SO_4$, HCl, $HNO_3$, and $H_2CO_3$.

23. An etch method for use in forming isolation structures, the method comprising:
providing a silicon substrate;
providing an oxide isolation region formed in the silicon substrate;
etching the silicon substrate with an etch composition at an etch rate that is greater than about 3 times an etch rate of the oxide isolation region etched with the etch composition, wherein the etch composition comprises ammonium fluoride, an inorganic acid, and an oxidizing agent.

24. The method of claim 23, wherein exposing the substrate includes exposing the substrate to the etch composition at a temperature in the range of about 20° C. to about 30° C.

25. The method of claim 23, wherein etching the silicon substrate includes etching the silicon substrate at an etch rate greater than about 9 Å/minute.

26. The method of claim 25, wherein etching the silicon substrate results in a silicon surface having a surface roughness in the range of about 1.25 Å RMS to about 1.30 Å RMS.

27. The method of claim 23, wherein providing the silicon substrate and the oxide isolation region formed therein includes providing a silicon region adjacent the oxide isolation region that is of a different thickness than a nonadjacent silicon region, wherein the difference in thickness is in a range of about 100 Å to about 200 Å, and further wherein etching the silicon substrate with the etch composition reduces the thickness difference to less than about 30 Å.

28. The method of claim 27, wherein providing the silicon substrate and the oxide isolation region formed therein includes:
etching a trench in the silicon substrate after patterning a stack of at least a thermal oxide layer and a silicon nitride layer;
filling the trench with at least one oxide material; and
removing the patterned stack, wherein removing the patterned stack includes an overetch to entirely remove the thermal oxide layer resulting in the silicon region adjacent the oxide isolation region that is of a different thickness than the nonadjacent silicon region.

29. The method of claim 23, wherein the etch composition has a pH in the range of about 7.0 to about 8.0.

30. The method of claim 29, wherein the oxidizing agent comprises hydrogen peroxide, and further wherein the etch composition comprises the ammonium fluoride in a range of about 25 percent to about 40 percent by weight of the etch composition and the hydrogen peroxide in a range of about 5 percent to about 15 percent by weight of the etch composition.

31. The method of claim 30, wherein the inorganic acid is at least one inorganic acid selected from the group consisting of HF, $H_3PO_4$, $H_2SO_4$, HCl, $HNO_3$, and $H_2CO_3$.

* * * * *